United States Patent [19]

Seidler

[11] Patent Number: 4,605,278

[45] Date of Patent: Aug. 12, 1986

[54] SOLDER-BEARING LEADS

[75] Inventor: Jack Seidler, Flushing, N.Y.

[73] Assignee: North American Specialties Corporation, College Point, N.Y.

[21] Appl. No.: 737,830

[22] Filed: May 24, 1985

[51] Int. Cl.⁴ .............................................. H01R 4/02
[52] U.S. Cl. .................................. 339/275 B; 29/876
[58] Field of Search ................. 29/843, 844, 874, 876, 29/884; 339/275 R, 275 B, 275 T, 17 C, 17 LM, 17 M, 258 R, 258 P

[56] References Cited

U.S. PATENT DOCUMENTS 4,120,558 10/1978 Seidler ........................... 339/275 T
4,203,648 5/1980 Seidler ........................... 339/275 T
4,503,609 3/1985 MacKay ......................... 339/258 P Primary Examiner—Gil Weidenfeld
Assistant Examiner—Gary F. Paumen
Attorney, Agent, or Firm—Darby & Darby

[57] ABSTRACT

A solder-bearing lead useful as a terminal or contact which may be fabricated by rapid progressive stamping techniques is disclosed in which side ears are formed on the contact blank, and then bent upwardly out of their initial plane. These ears are formed to hold a solder mass in a position where the solder can confront the conductive area to which the lead is to be soldered, permitting convenient surface mounting of components having such leads, on a substrate, and permitting convenient connection of terminals to other components or substrates.

9 Claims, 11 Drawing Figures

SOLDER-BEARING LEADS

BACKGROUND OF THE INVENTION

This invention relates to solder-bearing contacts, terminal elements and leads, particularly for use with multiple-contact connectors and electronic circuit boards, and for surface-mounted devices.

In the electronic equipment industry, an important necessity is the rapid and accurate assembly of leads, terminals and contacts with the contact pads of printed circuit boards or other substrates. For convenience of connecting such elements, it has previously been suggested to facilitate the soldering of their connection by securing a solder slug or mass to one of the elements so that, when positioned in engagement with the other element and heated, the molten solder will cover the adjacent surfaces of both elements to form when cooled a soldered joint providing both a mechanical coupling and an electrical connection between the elements. Various arrangements of solder-holding elements are disclosed in Seidler U.S. Pat. Nos. 4,120,558 and 4,203,648, in each of which a lead has a finger struck from it, for holding the solder mass to the lead.

However, as the art tends toward greater miniaturization in this field, there has been a reduction in the size of and spacing between the contact pads on printed circuit boards, for example, requiring corresponding reduction in the size and spacing of the leads for connection thereto.

SUMMARY OF THE INVENTION

It is a principal object of the present invention to provide a solder-bearing lead for attachment to a contact pad on a printed circuit board or like substrate, or for mounting a circuit component on a substrate, suitable for being continuously stamped from a thin strip of metal at high speed with an improved arrangement for holding the solder mass to provide the necessary solder for a soldered joint, without weakening the lead. Instead of retaining the solder mass by means of a finger struck from the elongated body of the lead (which for narrow leads might only weakly retain the solder and also weaken the lead by unduly reducing its already small cross-section), the solder mass is retained by integral tabs or ears initially extending laterally from the elongated blank body, and then bent to form a solder-retaining channel in which the tabs may stake the solder. This provides a secure mechanical attachment for the solder mass to the lead, to supply each lead with the necessary supply of solder at a proper location for its attachment to and electrical bonding to another conductive surface. This is particularly desirable for sur-facemounted devices on printed circuit boards or other substrates. In addition, this arrangement can be made by automatic progressive stamping by simple and efficient steps, at high speed.

The invention accordingly comprises an article of manufacture and method of fabrication possessing the features, properties and relation of elements exemplified in the embodiments described in the following, the scope of the invention being set out in the appended claims.

BRIEF DESCRIPTION OF THE DRAWINGS

With particular reference to the drawings, several forms of the invention are shown in the various figures, where like reference characters designate like parts throughout the several views. In the drawings.

DESCRIPTION OF PREFERRED EMOBIDMENTS

Figure 1:
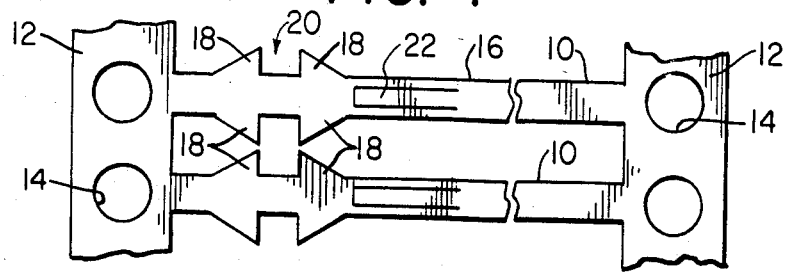
FIG. 1 shows a plan view of a strip formed into flat blanks for use in making one embodiment of the improved lead of the invention.

Referring to the drawings, FIG. 1 illustrates a stamped strip having a sequence of individual blanks 10 for the leads of the invention, formed by stamping from a conductive strip (as of beryllium copper or like resilient and conductive material), with the individual lead blanks 10 extending between a pair of carrier strips 12. Strips 12 may carry sprocket holes 14 for indexing the lead blanks step-by-step through subsequent progressive stamping steps for forming the blanks into final form.

Each lead is formed of an elongated body section 16 of length appropriate for the intended use of the finished lead, and having oppositely extending tabs 18 on its lateral edges, in the form of sloping extensions with a gap 20 therebetween. The gap 20 is dimensioned to have a width substantially equal to the width of a solder wire to be laid therein, and a depth dimension somewhat less than the solder wire dimension, as will be seen. In addition, the body section 16 is slitted or cut to form a resilient finger 22. It will be understood that the tabs are not necessarily triangular in shape but may be rectangular or of other shape, preferably with straight edges extending transversely of the lead body.

Figure 2:
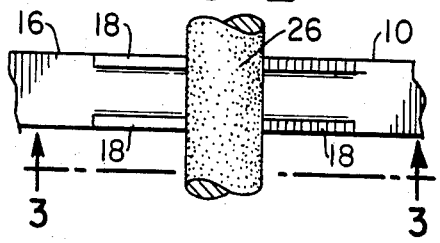
FIG. 2 is a plan view of one of the leads made from the blank of FIG. 1, formed to hold a solder mass.
Figure 3:
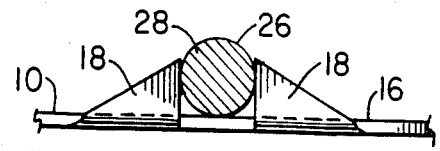
FIG. 3 is a sectional elevation view of the arrangement of FIG. 2, showing the solder mass positioned between retaining tabs.

For holding a solder mass or slug to the lead, in the forming process, the tabs 18 are bent out of the plane of the body section 16 into a position substantially perpendicularly, as shown in FIGS. 2 and 3, thereby providing a channel 24 having a "floor" formed by the body section 16, and sides formed by the edges of the tabs 18.

Figure 4:
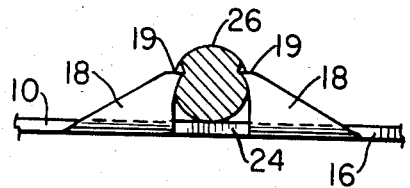
FIG. 4 shows the arrangement of FIG. 3 with the retaining tabs staked into the solder mass.

Into this channel is laid solder, preferably as a wire 26. The wire 26 may be cut on either side of the body 16 an appropriate distance from the tabs 18 to supply the desired amount of solder for the soldering operation. The solder wire 26 preferably closely conforms to the width of the channel 24, and may be flush with or extend somewhat above the channel 24, as seen in FIG. 3, so that the solder has an exposed surface 28. After the solder wire is positioned within channel 24, and either before or after it is cut into the appropriate section lengths, the tabs 18 may be bent inwardly to stake the solder mass 26 in place and thereby retain it physically connected to the body section 16, as shown in FIG. 4.

It will be understood that this solder-retaining arrangement, depicted in FIGS. 2 to 4, may be used in various applications in the electronics art, some of which are described below.

Figure 5:
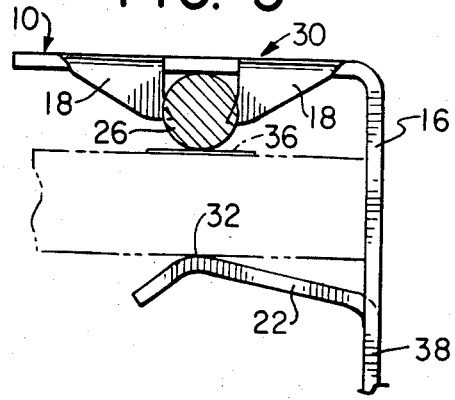
FIG. 5 shows a side sectional elevational view of an edge clip solderable connector for a printed circuit board or the like, made from the blank of FIG. 1.

In one use, the blank 10 of FIG. 1 may be formed with a resilient finger 22. As seen in FIG. 5, the solder-bearing portion 30 of the lead is bent substantially at a right angle to the remainder of the body portion 16 and the spring finger 22 is positioned with a bend 32 opposite the solder mass 26. This provides a springy gap between the solder 26 and the bend 32 within which may be inserted a circuit board or other substrate 34, having a conductive area or contact pad 36 to which it is desired to solder the lead. The resilience of finger 22 serves to retain the lead in position on the circuit board 34 before the soldering is done, and as the solder melts upon application of heat, the finger 32 serves to allow the tabs 18 to move relatively toward and into contact with the conductive area 36, to provide good electrical contact between the lead and the conductive area 36 when the solder re-solidifies. In this application, the lead forms an edge clip for the circuit board 34, and the terminal end 38 of the lead may be suitably formed in a number of ways for connection to other equipment, such as being formed as a pin for insertion into a contact receptacle, or as a wire-wrapped post termination, or as a further solderable arrangement, indicated below.

Figure 6:
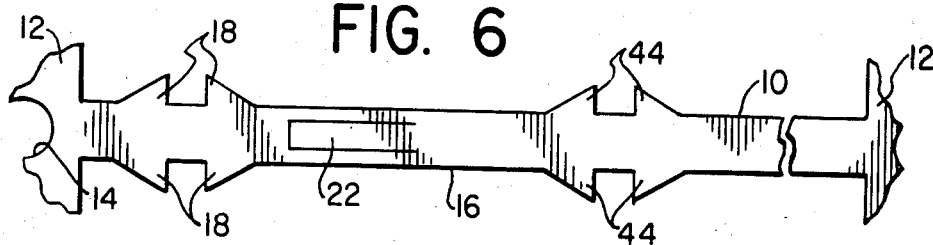
FIG. 6 shows a plan view of a modified form of the stamped blank for another embodiment of the invention.
Figure 7:
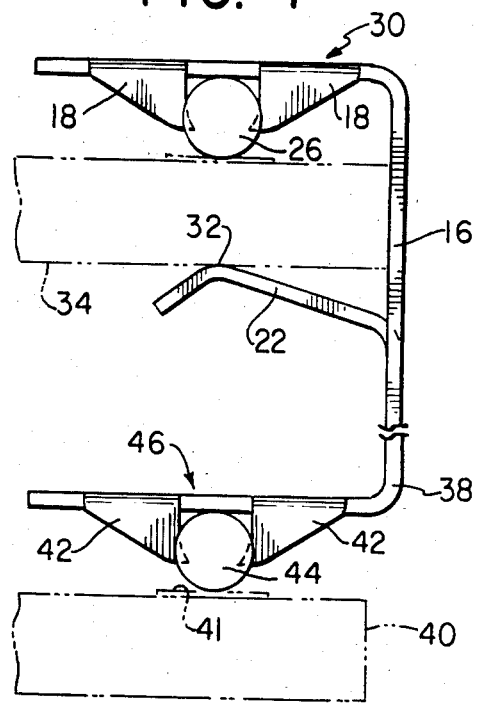
FIG. 7 shows a side elevation view of an edge clip for a printed circuit board, which may be formed from the blank of FIG. 6, and is adapted for surface mounting on a substrate.
Figure 8:
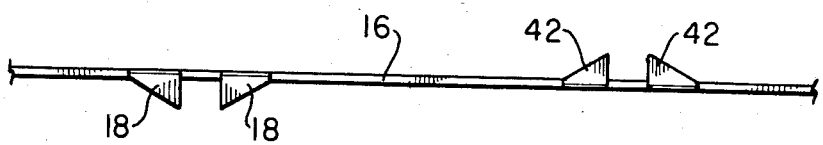
FIG. 8 shows a side elevation view of a partially formed blank for the embodiment of FIGS. 6 and 7.

FIG. 6 shows a modified form of strip blank carrying a lead blank as a modification of FIG. 1. In this form each lead blank is provided with a second set of solder-retaining tabs 44. As shown in FIG. 7, the terminal portion 38 of the lead is formed with a solder-retaining arrangement 46 essentially the same as arrangement 30 of FIG. 5. However, in this instance, the tabs 44 are bent from the body portion 16 in a direction opposite to that of the tabs 18, as shown in FIG. 8, so that the terminal solder-retaining arrangement 46 may be used for surface mounting the circuit board 34 on a further substrate 40 for connection to a conductive area 41 on substrate 40.

In an alternate form (not illustrated) the tabs 44 may be bent in the same direction as tabs 18, in which case the terminal portion 38 of the lead, instead of extending to the left as seen in FIG. 7, would extend to the right.

Figure 9:
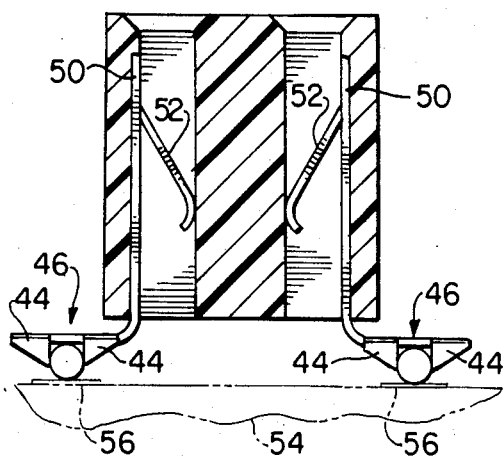
FIG. 9 shows a transverse elevation sectional view of a vertically mounted pin-receiving connector adapted for surface mounting on a substrate by use of the solderable lead of the present invention.

The solder-retaining arrangement of the present invention may also be used as a terminal portion of other forms of leads, terminals, contacts, and connectors. Thus, as seen in FIG. 9, the solder-retaining arrangement 46 may be the terminal for a contact 50 of a multiple-contact connector where each contact 50 is in a channel 48 into which extends a spring finger 52 integrally formed with the contact 50, for mating contact with a pin when inserted into channel 48. FIG. 9 illustrates a cross-section of a dual row of pin-receiving receptacles, each formed as shown in FIG. 9. It will be understood that the same arrangement may be used for single-row or other multiple-row connectors, permitting surface mounting upon a substrate having conductive areas 56 to which the contacts 50 are to be soldered. While the channels 48 are shown in this instance as perpendicular to the substrate 54, suitable for a vertically oriented connector, other arrangements may be made by which the connector may be oriented horizontally or at other angles.

Figure 10:
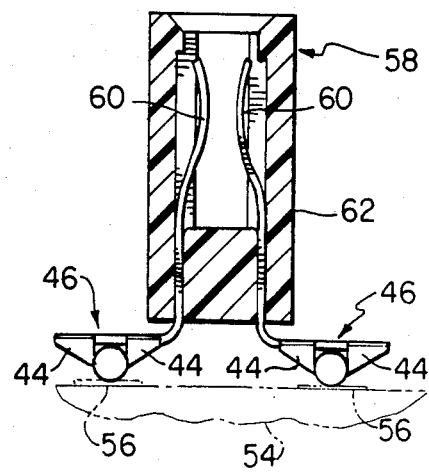
FIG. 10 is a transverse elevation sectional view of a connector for a vertically mounted printed circuit board, adapted to be mounted on a substrate by use of the solderable lead of the present invention.

FIG. 10 illustrates use of the solder-retaining terminal arrangement 46 for surface mounting a circuit board connector 58 on a substrate 54. This figure shows a transverse cross-section of a multiple-contact circuit board edge-connector having a housing 62 in which are mounted spring contacts 60 for separable connection to contact pads on the circuit board when inserted. It will be obvious how the blanks for forming the leads and contacts of FIGS. 9 and 10 are formed. In each case, there will be tabs such as 44 or 18 bent outwardly from the body of the lead, the remainder of the lead being suitably formed for its intended purpose as in FIGS. 5, 7, 9 or 10.

Figure 11:
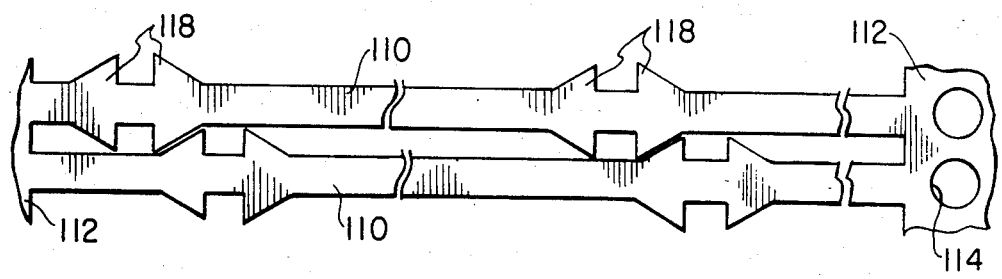
FIG. 11 shows a plan view of an alternate form of strip of blanks useful in the previous embodiments of the present invention for economy of material and providing closer spacing of the leads.

As shown in FIG. 1, the lead blanks 10 formed into the multiple blank strip are generally side-by-side and in alignment. However, in some instances it may be desirable to place them closer together as for automatic insertion into housings having closely-spaced channels, or for purposes of economizing on waste material. FIG. 11 shows how the blank leads 10 may be staggered on the carrier strip to place them more closely for this purpose.

It will be understood that the solder-retaining arrangement of the present invention is suitable for many other applications, where it will have the advantages discussed above as well as others. Accordingly, the above embodiments are to be deemed illustrative only and the present invention is defined by the appended claims.

What is claimed is:

1. A solder-bearing lead adapted to be soldered to a conductive surface, comprising
   an elongated strip-like body portion,
   said body portion having on each edge thereof a pair of spaced laterally extending tabs defining an opening therebetween,
   said openings being laterally aligned transversely of said strip,
   said pairs of tabs being bent substantially perpendicular from the body portion strip to align said openings to form a channel transversely of said strip, with said body portion forming a floor for said channel,
   a solder mass in said channel and bordered by said pairs of tabs,
   said tabs being bent inwardly of said channel to retain said solder mass therein,
   said solder mass having a dimension extending away from said body portion greater than the extent of said tabs, whereby said solder mass extends outwardly from said channel and may be placed in direct contact with the conductive surface to which said lead is to be soldered, while spacing said tabs from said surface and upon melting said solder mass, said tabs are permitted to move into contact with said conductive surface to make electrical contact therewith and to be retained in such contact upon re-solidification of said solder mass.

2. A lead as in claim 1 wherein said tabs and solder mass are adjacent one end of said lead, the other end of said lead being formed as an electrical element, whereby said electrical element may be surface-mounted on said conductive surface by juxtaposing said solder mass to said surface, melting said solder, and re-solidifying said solder.

3. A lead as in claim 2 wherein said element is a circuit board edge clip.

4. A lead as in claim 2 wherein said element is a pin-receiving connector contact.

5. A lead as in claim 2 wherein said element is a circuit board connector contact.

6. A lead as in claim 1 further including a spring finger integral with said lead body portion and positioned opposite to said solder mass to form a clip arrangement for a circuit board or the like.

7. A method of forming a solder-bearing lead adapted to be soldered to a conductive surface, comprising forming a flat elongated strip-like body portion blank, said blank having on each edge of said body portion a pair of laterally extending spaced tabs, aligned transversely of said body portion, bending a first pair of tabs on one edge of said body portion substantially perpendicularly of said body portion, bending a second pair of tabs on the other edge of said body portion substantially perpendicularly of said body portion and substantially parallel to said first pair, to form a channel therebetween, said channel having sides formed by the spaced tabs and a floor formed by said body portion, placing a solder mass in said channel, and staking the edges of said tabs with said solder mass to secure said solder mass to said body portion.

8. The method as in claim 7 wherein said solder mass extends outwardly of said channel beyond the tips of said tabs.

9. The method as in claim 8 wherein said solder mass extends into the spacing between said tabs on each edge of said body portion.

* * * * *